United States Patent
Zhou et al.

(10) Patent No.: US 11,875,283 B2
(45) Date of Patent: Jan. 16, 2024

(54) CONNECTIVITY BASED APPROACH FOR FIELD DEVELOPMENT OPTIMIZATION

(71) Applicant: CONOCOPHILLIPS COMPANY, Houston, TX (US)

(72) Inventors: Hui Zhou, Houston, TX (US); Curt Schneider, Houston, TX (US); Iman Shahim, Houston, TX (US)

(73) Assignee: CONOCOPHILLIPS COMPANY, Houston, TX (US)

( * ) Notice: Subject to any disclaimer, the term of this patent is extended or adjusted under 35 U.S.C. 154(b) by 464 days.

(21) Appl. No.: 15/725,821

(22) Filed: Oct. 5, 2017

(65) Prior Publication Data
US 2018/0107952 A1 Apr. 19, 2018

Related U.S. Application Data

(60) Provisional application No. 62/408,325, filed on Oct. 14, 2016.

(51) Int. Cl.
*G06Q 10/04* (2023.01)
*G06Q 10/0631* (2023.01)
(Continued)

(52) U.S. Cl.
CPC ............ *G06Q 10/04* (2013.01); *E21B 43/00* (2013.01); *G06F 30/20* (2020.01); *G06Q 10/047* (2013.01);
(Continued)

(58) Field of Classification Search
CPC ............ G06Q 10/04; G06Q 10/06313; G06Q 10/047; G06Q 10/06; E21B 43/00; G06F 30/20
See application file for complete search history.

(56) References Cited

U.S. PATENT DOCUMENTS

2008/0154505 A1* 6/2008 Kim .................. E21B 43/00
702/2
2010/0057418 A1* 3/2010 Li ..................... E21B 47/00
703/10
(Continued)

OTHER PUBLICATIONS

International Search Report for PCT/US2017/055358 dated Dec. 28, 2017; 3 pgs.
(Continued)

*Primary Examiner* — Eunhee Kim
(74) *Attorney, Agent, or Firm* — ConocoPhillips Company

(57) ABSTRACT

A method for creating a field development plan, comprising initializing, by a specially programmed computing system, a connectivity model, calibrating, by a specially programmed computing system, the connectivity model based on a plurality of reservoir simulation results, determining, by a specially programmed computing system, a travel time between wells and reservoir cells using a fast marching method, determining, by the specially programmed computing system, a hydrocarbon saturation based on the travel time to construct a model prediction, optimizing, by the specially programmed computing system, the connectivity model using a global optimization and a local optimization, and constructing, by the specially programmed computing system, at least one well file using the optimized connectivity model.

19 Claims, 4 Drawing Sheets

(51) Int. Cl.
| | |
|---|---|
| *E21B 43/00* | (2006.01) |
| *G06Q 10/047* | (2023.01) |
| *G06Q 10/06* | (2023.01) |
| *G06F 30/20* | (2020.01) |

(52) U.S. Cl.
CPC ....... *G06Q 10/06* (2013.01); *G06Q 10/06313* (2013.01)

(56) References Cited

U.S. PATENT DOCUMENTS

| | | | | |
|---|---|---|---|---|
| 2010/0185427 | A1 | 7/2010 | Tilke et al. | |
| 2010/0235154 | A1* | 9/2010 | Meurer | G01V 11/00 703/10 |
| 2012/0143575 | A1* | 6/2012 | Imhof | G01V 11/00 703/2 |
| 2012/0179439 | A1* | 7/2012 | Killough | G01V 99/005 703/2 |
| 2012/0253770 | A1* | 10/2012 | Stern | G01V 11/00 703/10 |
| 2013/0033489 | A1* | 2/2013 | Chentanez | G06T 13/60 345/419 |
| 2013/0338984 | A1* | 12/2013 | Braaksma | G01V 1/345 703/10 |
| 2016/0154127 | A1* | 6/2016 | Shevchenko | G01V 1/282 703/2 |

OTHER PUBLICATIONS

Castineira, David, et al—"Automatic Well Placement Optimization in a Channelized Turbidite Reservoir Using Adjoint Based Sensitivities", 2009, SPE International, SPE 119156, pp. 1-9; 9 pgs.
Forouzanfar, Fahim, et al—"A Two-State Well Placement Optimization Method Based on Adjoint Gradient", 2010, Society of Petroleum Engineers, SPE 135304, pp. 1-18; 18 pgs.
Bouzarkouna, Z., et al—"Partially Separated Meta-models with Evolution Strategies for Well Placement Optimization", 2011, SPE International, SPE 143292; pp. 1-9, 9 pgs.
Sarma, Pallav, et al—"Efficient Well Placement Optimization with Gradient-Based Algorithms and Adjoint Models", 2008, SPE International, SPE 112257, pp. 1-18; 18 pgs.
Handels, M., et al—"Adjoint-Based Well-Placement Optimization Under Production Constraints", 2007, SPE International, SPE 105797, pp. 1-7; 7 pgs.
Badru, O, et al—"Well Placement Optimization in Field Development", 2003, SPE International, SPE 84191, pp. 1-9; 9 pgs.
Guyaguler, Baris, et al—"Uncertainty Assessment of Well Placement Optimization", 2001, SPE International, SPE 71625, pp. 1-13; 13 pgs.
Morales, A.N., et al—"A New Modified Genetic Algorithm for Well Placement Optimization Under Geological Uncertainties", 2011, SPE International, SPE 143617, pp. 1-13; 13 pgs.
Cuadros, Jaime, et al—"Horizontal Well Placement Optimization for Heavy Oil Production in Girasol Field", 2010, SPE International, SPE 132884, pp. 1-15; 15 pgs.
Nakajima, L., et al—"Horizontal Well Placement Optimization Using Quality Map Definition", 2003, Canadian International Petroleum Conference, Paper 2003-053, Petroleum Society, Canadian Institute of Mining, Metallurgy & Petroleum, pp. 1-10; 10 pgs.
Zarei, Faraj, et al—"The Use of Neuro-Fuzzy Proxy in Well Placement Optimization", 2008, SPE International, SPE 112214, pp. 1-11; 11 pgs.
Morales, A., et al—"A Modified Genetic Algorithm for Horizontal Well Placement Optimization in Gas Condensate Reservoirs", 2010, SPE International, SPE 135182, pp. 1-23; 23 pgs.
Seifert, D., et al—"Well Placement Optimisation and Risking using 3-D Stohastic Reservoir Modelling Techniques", 1996, Society of Petroleum Engineers, SPE 35520, pp. 1-12; 12 pgs.
Montes, Guillermo, et al—"The Use of Genetic Algorithms in Well Placement Optimization", 2001, Society of Petroleum Engineers, SPE 69439, pp. 1-10; 10 pgs.
Ozdogan, Umut, et al—"Optimization of Well Placement with a History Matching Approach", 2004, Society Society of Petroleum Engineers, SPE 90091, pp. 1-14; 14 pgs.
Leeuwenburgh, Olwijn, et al—"Ensemble Methods for Reservoir Life-Cycle Optimization and Well Placement", 2010, Society Society of Petroleum Engineers, SPE 136916, pp. 1-8; 8 pgs.
Wang, Honggang, et al—"Optimal Well Placement under Uncertainty using a Retrospective Optimization Framework", 2011, Society Society of Petroleum Engineers, SPE 141950, pp. 1-19; 19 pgs.
Ding, D.Y.—"Optimization of Well Placement Using Evolutionary Algorithms", 2008, Society Society of Petroleum Engineers, SPE 113525, pp. 1-18; 18 pgs.
Ozdogan, Umut, et al—"Optimization of Well Placement Under Time-Dependent Uncertainty", 2006, Society Society of Petroleum Engineers, SPE 90091, SPE Reservoir Evaluation and Engineering, pp. 135-145; 11 pgs.
Xin, Song Yu, et al—"Thin Oil Columns Horizontal Wells Optimization Through Advance Well Placement Application in West China", 2010, Society Society of Petroleum Engineers, SPE 133660, pp. 1-10; 10 pgs.
Wang, Chunhong, et al—"Optimal Well Placement for Production Optimization", 2007, Society Society of Petroleum Engineers, SPE 111154, pp. 1-5; 5 pgs.
Guyaguler, Baris, et al—"Optimization of Well Placement in a Gulf of Mexico Waterflooding Project", 2000, Society Society of Petroleum Engineers, SPE 63221, pp. 1-10; 10 pgs.
Ayodele, O.R.—"Optimization of Well Placement and/or Borehole Trajectory for Minimum Drilling Cost (A Critical Review of Field Case Studies)", 2004, Canadian International Petroleum Conference, pp. 1-19; 19 pgs.

* cited by examiner

400

Start

402 — Initialize a connectivity model using a plurality of field development data 404 — Calibrate the connectivity model based on reservoir simulation results 406 — Determine a travel time between wells and reservoir cells using a fast marching method algorithm 408 — Determine the hydrocarbon saturation based on the travel time to build a model prediction 410 — Optimize the connectivity model 412 — Verify the connectivity model Output Data

FIG. 4

CONNECTIVITY BASED APPROACH FOR FIELD DEVELOPMENT OPTIMIZATION

CROSS-REFERENCE TO RELATED APPLICATIONS

This application is a non-provisional application which claims benefit under 35 USC § 119(e) to U.S. Provisional Application Ser. No. 62/408,325 filed Oct. 14, 2016, entitled "Connectivity Based Approach for Field Development Optimization", which is incorporated herein in its entirety.

BACKGROUND

In the oil and gas industry, operators may utilize field development plans that attempt to provide technical solutions for oil and gas field optimization. Field development plans are characterized based on a variety of activities and/or processes used to develop an oil and gas field. The activities and/or processes for a field development plan include, but are not limited to evaluating the environmental impact, applying geophysics to determine the geology of the subsurface, accounting for reservoir and production engineering considerations, considering the current infrastructure, and/or factoring well design and construction. Prior to an operator undertaking an oil and gas project, the operator may evaluate multiple project development options for the different activities and/or processes and subsequently select project development options based on a variety of field factors and tradeoffs. For instances, in deep water projects, an operator may select development options that attempt to maximize operational flexibility and scalability. Conversely, if budget constraints are a considerable factor, operators may attempt to reduce drilling cost by drilling fewer wells and improving efficiency of the hydrocarbon recovery for each of the drilled wells.

Designing a field development plan for an oil and/or gas field generally includes determining the location of well sites, the number of well sites, (e.g., new drilling wells and/or existing wells), and the well types. Determining the location of wells for the field development plan may be valuable in oil and gas exploration and production workflow, and field development plans may account for a variety of factors in determining the location of well sites. For instance, a field development plan may account for the geology of the subsurface when determining the placement of the wells in order to optimize efficiency and maintain well safety. The field development plan may consider constraints for the design and construct of the wells, such as arranging new drilling wells in locations that avoid existing wells. Additionally, the field development plan may factor in a variety of surface level constraints, such as topographic constraints and constraints related to existing facilities, for example, platforms and pipelines.

Although a field development plan may potentially reduce cost, uncertainty, and operation risk for an oil and gas development project, creating a field development plan is typically ingrained with a variety of complex factors that if not properly accounted for, could produce inaccurate results. In some instances, oil and gas field projects may suffer from lower-than-forecast oil and gas production and/or overrun budgets and schedules because of flaws in the field development plan. For example, the field development plan may be susceptible to inaccurate characterization of a reservoir because of the complexity of the subsurface characteristics. Flaws in the field development plan may also originate from certain design choices, such as not fully integrating available development technologies and simplifying the field development plan because of insufficient computing power needed to obtain accurate, large-scale filed development plans that are useful for field applications.

BRIEF SUMMARY

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the disclosed embodiments or to delineate the scope of the disclosed embodiments. Its sole purpose is to present some concepts in a simplified form as a prelude to the more detailed description that is discussed later.

In one embodiment, a method for creating a field development plan, comprising initializing, by a specially programmed computing system, a connectivity model, calibrating, by a specially programmed computing system, the connectivity model based on a plurality of reservoir simulation results, determining, by a specially programmed computing system, a travel time between wells and reservoir cells using a fast marching method, determining, by the specially programmed computing system, a hydrocarbon saturation based on the travel time to construct a model prediction, optimizing, by the specially programmed computing system, the connectivity model using a global optimization and a local optimization, and constructing, by the specially programmed computing system, at least one well file using the optimized connectivity model.

In another embodiment, an apparatus comprising: a processor, wherein the processor obtains computer executable instructions stored on a non-transitory medium that when executed by the processor causes the apparatus to initialize a connectivity model based on reservoir descriptions, economic factors, and development type, calibrate the connectivity model by automatically tuning one or more parameters in the connectivity model to a plurality of reservoir simulation results, construct a model prediction based on the connectivity model, wherein the connectivity model determines a hydrocarbon saturation from a travel time based on reservoir connectivity, optimize the connectivity model using a global optimization and a local optimization; and construct at least one well file based on the optimized connectivity model.

In another embodiment, a system comprising a model initialization module adapted to initialize a connectivity model; a model calibration module adapted to calibrate the connectivity model based on a plurality of reservoir simulation results; a model prediction module adapted to: determine a travel time between wells and reservoir cells using a fast marching method; and determine a hydrocarbon saturation based on the travel time to construct a model prediction; a model optimization module adapted to optimize the connectivity model using a global optimization and a local optimization; and a model verification module adapted to construct at least one well file using the optimized connectivity model.

BRIEF DESCRIPTION OF THE DRAWING

For a more complete understanding of this disclosure, reference is now made to the following brief description, taken in connection with the accompanying drawings and detailed description, wherein like reference numerals represent like parts.

FIG. 4 is flow chart of an embodiment of method for creating a hydrocarbon field development plan.

Figure 1:
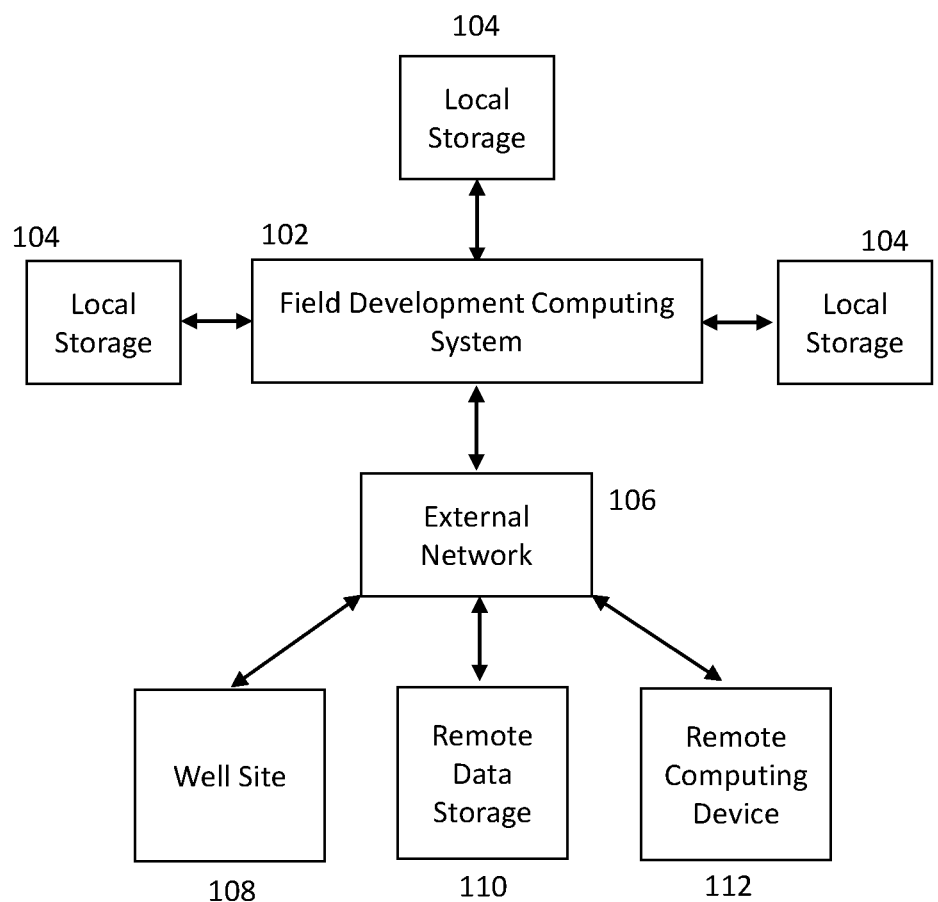
FIG. 1 is a schematic diagram of an embodiment of a field development optimization system, where various embodiments may operate within.

While certain embodiments will be described in connection with the preferred illustrative embodiments shown herein, it will be understood that it is not intended to limit the invention to those embodiments. On the contrary, it is intended to cover all alternatives, modifications, and equivalents, as may be included within the spirit and scope of the embodiments as defined by claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION

It should be understood that, although an illustrative implementation of one or more embodiments are provided below, the various specific embodiments may be implemented using any number of techniques known by persons of ordinary skill in the art. The disclosure should in no way be limited to the illustrative embodiments, drawings, and/or techniques illustrated below, including the exemplary designs and implementations illustrated and described herein. Furthermore, the disclosure may be modified within the scope of the appended claims along with their full scope of equivalents.

Disclosed herein are one or more embodiments that reduce the computational expense and improve modeling accuracy when creating a hydrocarbon field development plan. The hydrocarbon field development plan optimizes the number, placement, and/or type of wells within a hydrocarbon field by initializing, calibrating, predicting, optimizing and/or verifying a connectivity model. The connectivity model predicts hydrocarbon (e.g., oil and/or gas) production in a reservoir based on reservoir connectivity. In one embodiment, the connectivity model may initialize and calibrate information produced from a reservoir simulator. Based on the information produced from the reservoir simulator, the connectivity model may account for the travel time between wells and reservoir cells using a fast marching method. The connectivity model may also determine a hydrocarbon saturation change in terms of the travel time. By doing so, the connectivity model may generate a production prediction that potentially can be obtained in a single time step rather than performing multiple time steps (e.g., in the order of hundreds of steps) to advance to a reliable model prediction. The connectivity model may also utilize one or more global and/or local optimization algorithms to evaluate the production prediction and economic value for the generated connectivity model predictions in a given field development. After the optimizing process, one or more embodiments within the disclosure may verify the overall computation for the selected and optimized connectivity model used for the hydrocarbon field development plan.

FIG. 1 is a schematic diagram of an embodiment of a field development optimization system 100, where various embodiments may operate within. As shown in FIG. 1, the field development optimization system 100 may comprise a field development computing system 102 and one or more local data storage units 104. The field development computing system 102, which is discussed in more detail in FIGS. 2 and 3, may be a workstation, host, server, mainframe, super computer, and/or any other computing device configured to perform the specialized operation of creating a hydrocarbon field development plan by evaluating connectivity of a reservoir and building model predictions using a connectivity model. Generally, field development computing system 102 may produce optimal hydrocarbon field development plans in real-time while minimizing data input. In other words, the field development computing system 102 may create an optimized hydrocarbon field development plan by optimizing the well counts, well locations, and/or well types (e.g., primary depletion, water flooding, gas injection, and/or hydraulic fractured) without requiring hours to run the simulation. For example, the field development computing system 102 may run a blackoil waterflood simulation for a ten-year period of production with a reservoir model comprising one million cells in about one second rather than having a simulation time of about more than an hour.

The local data storage units 104 may be any non-transitory device capable of storing data, such as memory drives (e.g., universal serial bus (USB) drives), hard disk drives, CDs, DVDs, personal computers, and/or portable computing devices. In other words, the local data storage units 104 may be any time of computer-readable media except for transitory, propagating signals. In one embodiment, the local data storage units 104 may store field development data used to create a hydrocarbon field development plan that include, but are not limited to reservoir descriptions, seismic survey data, reservoir simulation data, economic factors, and/or well data from existing wells. The local data storage units 104 may be locally coupled to the field development computing system 102 via one or more wired connections, one or more wireless connections, one or more logical connections, one or more local area networks (LANs), and/or one or more local virtual networks. For example, the field development computing system 102 may be coupled to the local data storage units 104 via a private network or some other network that is not be publicly accessible, such as an enterprise network. In another embodiment, the field development computing system 102 and the local data storage units 104 may be located at or near a well site and connected to each other via an electrical cable or a wireless connection.

The field development computing system 102 may be linked to one or more remote devices via an external network 106. Using FIG. 1 as an example, the field development computing system 102 is linked to a well site 108, a remote data storage 110, and a remote computing device 112 using the external network 106. The external network 106 may comprise at least one network, such as the Internet, configured to transport data and support communication between the field development computing system 102 and one or more remote devices, such as the well site 108, the remote data storage 110, and the remote computing device 112. The external network 106 may comprise a wide variety of telecommunication nodes, such as routers, servers, gate-ways, and/or bridges to form hard-wired networks (e.g., a fiber optic network), wireless networks (e.g., wireless fidelity (Wi-Fi), cellular network, and/or microwave transmission), virtual networks, and/or other type of networks that operate in the electrical and/or optical domains. Network 106 may transport data using one or more communication protocols known by persons of ordinary skill in the art, such as the Internet Protocol (IP), Multiprotocol Label Switching (MPLS), and/or Ethernet.

External network 106 may transfer field development data from one or more well sites and/or other area of interests to the field development computing system 102. Specifically, FIG. 1 illustrates that the field development optimization system 100 may obtain transfer field development data from a well site 108, a remote data storage unit 110, and/or a remote computing device 112. The well site 108, remote data storage unit 110, and/or remote computing device 112 may each comprise at least one computer, server, and/or other computing device that receives, processes, stores, and/or generates data regarding one or more wells and/or reservoirs located at one or more remote locations (e.g., remote well site). For example, well data received from the well site 108, remote data storage unit 110, and/or remote computing device 112 may include, but are not limited to core samples, pressure measurements, factor information, mud logs, seismic information, measurement while drilling data, gas flow detection, drill cuttings, and/or sidewall plugs. Additionally, the field program development plan system 102 may receive from the well site 108, the remote data storage unit 110, and/or the remote computing device 112 other types of field development data, such as reservoir descriptions (e.g., geologic model and fluid properties) and economic factors associated the exploration and/or production of the hydrocarbon (e.g., oil price or well cost).

As persons of ordinary skill in the art are aware, although FIG. 1 illustrates an embodiment of a field development optimization system 100 used to create a hydrocarbon field development plan, the disclosure is not limited this particular embodiment as illustrated in FIG. 1. For instance, although FIG. 1 illustrates that the field development optimization system 100 receives well data and other types of data for creating a hydrocarbon field development plan using an external network 106, other embodiments of the field development optimization system 100 may utilize only LANs, or a private network, and may not connect to an external network, such as the Internet. Additionally, the field development computing system 102 may be coupled to a plurality of well sites 108, remote data storage unit 110, and/or remote computing devices 112, all of which could be located in one or more geographic regions. Other embodiments of the field development optimization system 100 may have the field development computing system 102 and one or more of the local data storage units 104 connected as a single device rather than being separate devices. Persons of ordinary skill in the art are aware that the field development optimization system 100 may comprise other components well known in the art, such as sensors, display modules, user interfaces, and/or powers sources, not explicitly shown in FIG. 1. The use and discussion of FIG. 1 is only an example that facilitates ease of description and explanation.

Figure 2:
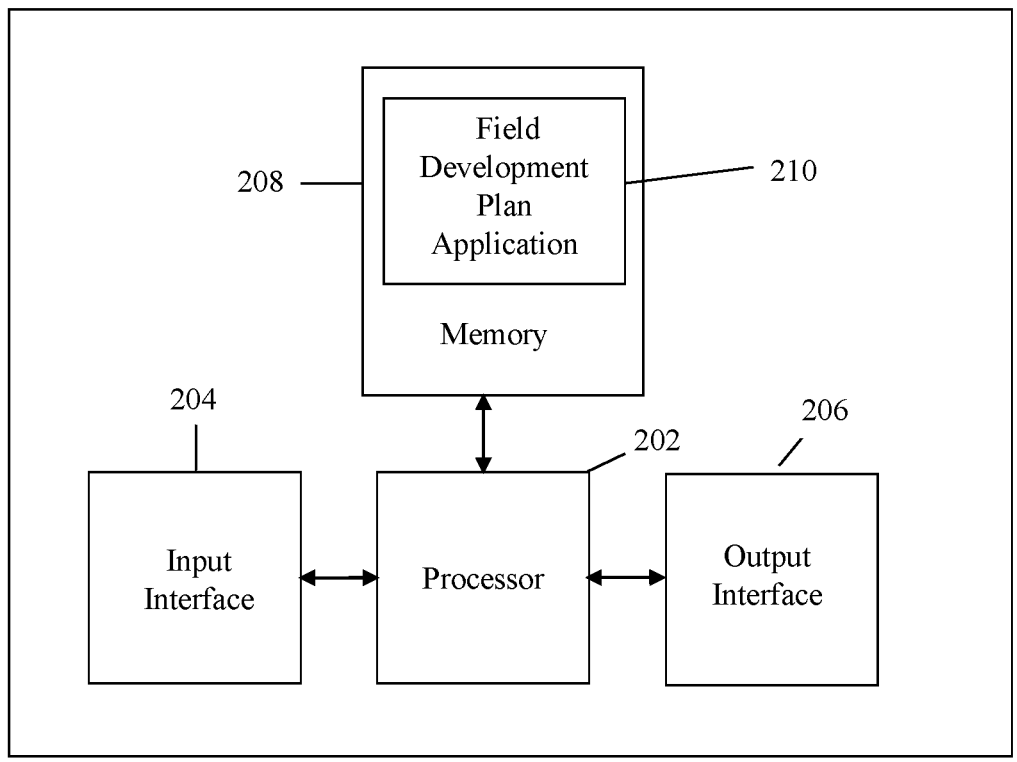
FIG. 2 is a schematic diagram of an embodiment of a field development computing system suitable for implementing one or more embodiments of the disclosure.

FIG. 2 is a schematic diagram of an embodiment of a field development computing system 200 that may correspond to or may be part of a computer and/or any other computing device, such as a workstation, host, server, mainframe, super computer, and/or portable computing device. Using FIG. 1 as an example, the field development computing system 200 may correspond to or be part of the field development computing system 102 as described in FIG. 1. The field development computing system 200 comprises a processor 202, which may be also be referenced as a central processor unit (CPU). The processor 202 may communicate (e.g., via a system bus) and/or provide instructions to other components within the field development computing system 200, such as the input interface 204, output interface 206, and/or memory 208. In one embodiment, the processor 202 may comprise one or more multi-core processors and/or memory mediums (e.g., cache memory) that function as buffers and/or storage for data. Additionally, processor 202 may be part of one or more other processing components, such as application specific integrated circuits (ASICs), field-programmable gate arrays (FPGAs), and/or digital signal processors (DSPs). Although FIG. 2 illustrates that processor 202 may be a single processor, processor 202 is not so limited and instead may represent a plurality of processors. The processor 202 may be configured to implement any of the methods described herein, which include method 400 as described in FIG. 4.

FIG. 2 illustrates that memory 208 may be operatively coupled to processor 202. Memory 208 may be a non-transitory computer-readable medium configured to store various types of data. In other words, the memory 208 may be any time of computer-readable medium except for transitory, propagating signals. For example, memory 208 may include one or more memory devices that comprise secondary storage, read-only memory (ROM), and/or random-access memory (RAM). The secondary storage is typically comprised of one or more disk drives, optical drives, solid-state drives (SSDs), and/or tape drives and is used for non-volatile storage of data. In certain instances, the secondary storage may be used to store overflow data if the allocated RAM is not large enough to hold all working data. The secondary storage may also be used to store programs that are loaded into the RAM when such programs are selected for execution. The ROM is used to store instructions and perhaps data that are read during program execution. The ROM is a non-volatile memory device that typically has a small memory capacity relative to the larger memory capacity of the secondary storage. The RAM is used to store volatile data and perhaps to store instructions.

Figure 3:
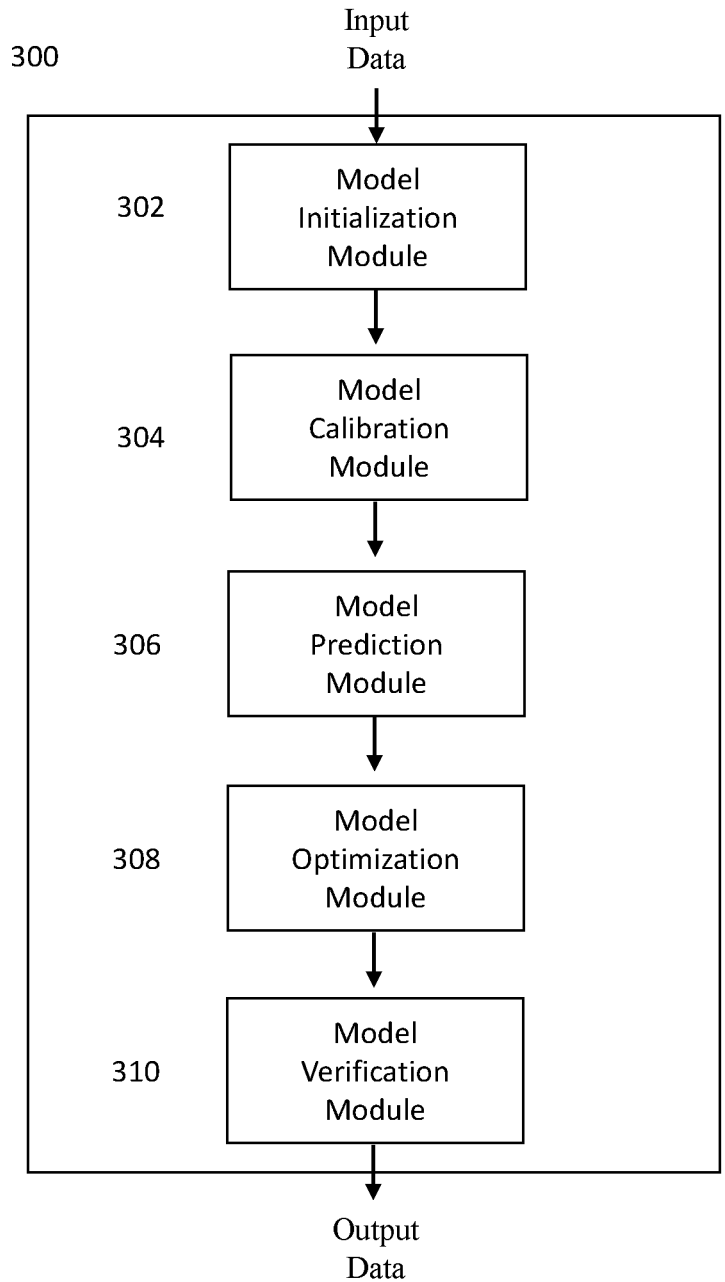
FIG. 3 is a schematic diagram of an embodiment of the field development optimization architecture for constructing an optimal well plan using connectivity models.

As shown in FIG. 2, the memory 208 is used to house the instructions for carrying out various embodiments described herein. In an embodiment, the memory 208 may comprise a field development plan application 210 that may be accessed and implemented by processor 202. Additionally, or alternatively, the field development plan application 210 may be stored and accessed within memory embedded in processor 202 (e.g., cache memory). The field development plan application 210 may be configured to provide computer executable instructions that create a connectivity model for the hydrocarbon field development plan. Specifically, the field development plan application 210 may be able to integrate reservoir properties and relate them with flow using the connectivity model. The connectivity model may characterize a reservoir by determining a travel time that represents the connectivity between wells and reservoir cells and establish an oil and/or gas saturation change from the travel time. In one embodiment, the field development plan application 210 may be implemented using the field development optimization architecture 300 as shown in FIG. 3 and/or steps as described in method 400 in FIG. 4.

Memory 208 may interface with a system bus (e.g., a computer bus) so as to communicate and/or transmit information stored in memory 208 to processor 202 during execution of software programs, such as software applications that comprise program code, and/or computer executable process steps that incorporate functionality described herein (e.g., the field development plan application 210). Persons of ordinary skill in the art are aware that software programs may be developed, encoded, and compiled in a variety computing languages for a variety software platforms and/or operating systems and subsequently loaded and executed by processor 202. In one embodiment, the compiling process of the software program, (e.g., field development plan application 210), may transform program code written in a programming language to another computer language such that the processor 202 is able to execute the programming code. For example, the compiling process of the software program may generate an executable program that provides encoded instructions (e.g., machine code instructions) for processor 202 to accomplish specific, non-generic, particular computing functions.

After the compiling process, the field development plan application 210 may then be loaded as computer executable instructions or process steps to processor 202 from storage (e.g., memory 208, storage medium/media, removable media drive, and/or other storage device) and/or embedded within the processor 202. Processor 202 can execute the stored instructions or process steps in order to perform instructions or process steps (e.g., the field development plan 210) to transform the field development computing system 200 into a non-generic, particular, specially programmed machine or apparatus. Stored data, e.g., data stored by a storage device, can be accessed by processor 202 during the execution of computer executable instructions or process steps to instruct one or more components within the field development computing system 200.

Alternatively, rather than programming and/or loading executable instructions onto memory 208 and/or processor 202 to form a non-generic, particular machine or apparatus, persons of ordinary skill in the art are aware that stored instructions may be converted and implemented as hardware customized for a particular use. In one embodiment, implementing instructions, such as determining hydrocarbon (e.g., oil) saturations changes from time travel and/or other model creating and optimization functions, by loading executable software into a computing device, can be converted to a hardware implementation by well-known design rules. For example, the compiling process of the software program, (e.g., field development plan application) 210 may build a sequence of instruction bits that control and arrange a sequence of control gate-level components that write data onto buses, into latches and registers, across channels, memory, and/or other components of the processor 202 and/or memory 208. The compiling of the field development plan application 210 may produce gate-level components with fixed relationships designed to accomplish specific, non-generic, particular computing functions, such as determining the time travel between wells and reservoir cells using a fast marching method.

The decisions between implementing a concept in software versus hardware may depend on a number of design choices that include stability of the design and numbers of units to be produced and issues involved in translating from the software domain to the hardware domain. Often a design may be developed and tested in a software form and subsequently transformed, by well-known design rules, to an equivalent hardware implementation in an ASIC or other application specific hardware that hardwires the instructions or process steps of the software. In the same manner as a machine controlled by a new ASIC is a non-generic, particular, specially programmed machine or apparatus, likewise a computing device (e.g., a computer) that has been programmed and/or loaded with executable instructions or process steps (e.g., the field development computing system 210) should be viewed as a non-generic, particular, specially programmed machine or apparatus.

FIG. 2 also illustrates that the processor 202 may be operatively coupled to an input interface 204 configured to receive reservoir descriptions, seismic survey data, simulation data, economic factors, and/or well data, and an output interface 206 configured to transmit, output and/or display the simulated results, seismic data, and/or other geophysical information. The input interface 204 may be configured to obtain the development field data via cables, connectors, wireless connections and/or other communication protocols. In one embodiment, the input interface 202 may be a network interface that comprises a plurality of ports configured to receive and/or transmit data via a network. In particular, the network interface may transmit the seismic data via wired links, wireless link, and/or logical links. Other examples of the input interface 204 may be universal serial bus (USB) interfaces, CD-ROMs, DVD-ROMs and/or connections to one or more seismic receivers. The output interface 206 may include, but is not limited to one or more connections for a graphic display (e.g., monitors), a printing device that produces hard-copies of the generated results, and/or a plurality of ports that transmit data via cables, connectors, wireless connections, and/or other communication protocols.

Persons of ordinary skill in the art are aware that the field development computing system 200 may comprise other components well known in the art, such as sensors, display modules, user interfaces, and/or powers sources, not explicitly shown in FIG. 2. For ease of discussion, FIG. 2 may exclude other common or typical computing components known by persons of ordinary skill in the art.

FIG. 3 is a schematic diagram of an embodiment of the field development optimization architecture 300 for constructing an optimal well plan using connectivity models. As shown in FIG. 3, the field development optimization architecture 300 may comprise a model initialization module 302, a model calibration module 304, a model prediction module 306, a model optimization module 308, and a model verification module 310. Each of the modules in the field development optimization architecture 300 may be implemented using hardware, software, or both. For example, in one embodiment, the field development optimization architecture 300 may be implemented using the field development computing system 200 as described in FIG. 2. In another embodiment, the modules in the field development optimization architecture 300 may be implemented using an ASIC based computing system.

The model initialization module 302 is configured to receive field development data, such as reservoir descriptions (e.g., geologic model and fluid properties), seismic survey data, simulation data, economic factors relating to oil and gas field development (e.g., oil and/or well cost), development type (e.g., depletion, waterflood, gas injection, hydraulic fracturing), and/or well data as input data. In one embodiment, the reservoir descriptions may be organized in a form compatible with one or more reservoir simulators known by persons of ordinary skill in the art, such as Eclipse or PSim. The reservoir simulator may generate a grid file, initial hydrocarbon (e.g., oil and/or gas) saturation, transmissibility, and/or other reservoir data into a unified form. The input data is then read into the model initialization module 302 for initialization of the connectivity model. The model initialization module 302, based on the input data, may perform initialization calculations, such as calculation of pressures and fluid saturations. In one embodiment, the initialized connectivity model may be in static equilibrium, where distinct fluid contacts appear at pre-determined depths and the potential, which includes the sum of pressure and gravity, may be about equal. Organizing the reservoir descriptions to be compatible with reservoir simulators may facilitate initialization, calibration, and verification of the connectivity model.

The model calibration module 304 is configured to receive an initialized connectivity model and to automatically tune or modify one or more parameters associated with the connectivity model to match the reservoir simulation results. In particular, the model calibration module 304 may be beneficial for generating a relatively high fidelity approximation and improving the results of the model optimization process typically performed by the model optimization module 308. To obtain these benefits, the model calibration module 304 may automatically generate relatively a few number of reservoir calibration simulation cases with wells that are randomly placed over the reservoir. In one embodiment, the model calibration module 304 may receive the number of randomly placed wells directly from user through a user interface or automatically determine the number of randomly placed wells based off of one or more pre-determined criteria, such as oil and/or well cost. Examples of parameters that the model calibration module 304 may automatically tune or modify include the resulting multipliers of velocity and maximum saturation change. The model calibration module 304 may automatically tune or modify the one or more parameters using an internal optimization algorithm.

After model calibration, the model prediction module 306 processes the connectivity model to predict oil production for one or more reservoirs. The model prediction module 306 uses reservoir connectivity to predict oil production for a reservoir. Reservoir connectivity involves determining the travel time for the reservoir and determining a hydrocarbon (e.g., oil and/or gas) saturation change from the travel time. The travel time in the connectivity model represents the connectivity between wells and reservoir cells and may be computed using a fast marching method. Travel time may be used to determine how reservoir and wells are connected and for evaluating reservoir and well qualities. Travel time may be expressed using equation 1:

$$t_{AB} = \sum_{i \in L_{AB}} \frac{d_i}{v_i} \qquad (1)$$

Variable $t_{AB}$ in equation 1 represents the travel time from a cell A to a second cell B. $L_{AB}$ represents a set of cells in the shortest path between cell A and cell B. In other words, $L_{AB}$ represents the shortest path between two arbitrary cells. Variable $v_i$ represents the velocity between neighboring cell, and variable $d_i$ represents the distance between the neighboring cells.

In determining travel time, the model prediction module 306 may compute velocity using Darcy's law, which is expressed using equation 2 below:

$$v_i = \frac{k}{\mu} \nabla p \qquad (2)$$

Variable k represents the intrinsic permeability of the medium (e.g., reservoir medium between cell A and cell B); $\mu$ represents the length of where the pressure drop is taking place; and $\nabla p$ represents the pressure gradient vector. The model prediction module 306 can use the calibrated velocity multiplier described above, such as the pressure gradient vector, to improve the quality of the velocity approximation. In one embodiment, to evaluate equation 2, the pressure gradient vector may be approximated using a linear distribution of pressure that sets the pressure gradient vector to a constant. In another embodiment, the pressure gradient vector may be approximated using a two-dimensional (2D) pressure solver that uses the steady-state pressure equations as shown in equation 3 and 4:

$$\nabla * k \lambda_t \nabla p = 0 \qquad (3)$$

$$p(x_{well}) = BHP \qquad (4)$$

To improve efficiency, k and $\lambda_t$ may be approximated by a 2D average along a vertical direction. The 2D pressure solver may be used to solve for 2D pressure equations that produce relatively smooth functions for pressure gradient vector that are dependent on permeability. In another embodiment, to approximate the pressure gradient vector, a fast marching method, which was introduced by James Sethian in 1996, may be implemented to determine the shortest paths between two arbitrary cells. In particular, the fast marching method may be able to process data structures, such as heap and/or binary trees. The fast marching method may in one step, obtain the travel time from sources to all other wells and/or reservoir cells.

The model prediction module 306 may determine the hydrocarbon saturation change from the travel time using an analytical saturation solver, such as Buckley-Leverett equation. Reservoir connectivity may relate to hydrocarbon recovery based on that multiphase flow is a travel process where the fluid typically travels along the shortest path. Along each of the path, determining transport may be a one dimensional (1D) problem in terms of travel time. The model prediction module 306 may use the Buckely-Leverett equation to derive the hydrocarbon saturation, which is shown below as equation (5) to solve the 1D problem.

$$\frac{\partial S}{\partial t} + v \frac{\partial f}{\partial x} = 0 \qquad (5)$$

In equation 5, the variable f represents the fractional flow of oil; S represents the saturation of the hydrocarbon, and v represents a transport velocity of the hydrocarbon. The Buckley-Leverett equation may be solved to derive changes in the hydrocarbon saturation in terms of the travel time, which is presented in equations 6 and 7 below.

$$S = \begin{cases} (f)^{-1}\left(\frac{x}{vt}\right) & \frac{x}{t} < vf'(\overline{S}) \\ 0 & \text{otherwise} \end{cases} \qquad (6)$$

$$S = \begin{cases} (f)^{-1}\left(\frac{T(x)}{t}\right) & \frac{T(x)}{t} < f'(\overline{S}) \\ 0 & \text{otherwise} \end{cases} \qquad (7)$$

In equation 7, variable T(x) may represent the travel time. By implementing a fast marching method to compute travel time and subsequently deriving changes in the hydrocarbon saturation in terms of the travel time by solving for the Buckley-Leverett equation, the model prediction module 306 may return a production prediction within a single time step. In other words, the model prediction module 306 accounts for reservoir connectivity, well interaction, and multiphase displacement to build an accurate model prediction within a single time step. Generating a final model prediction in a single time step rather than using more than one time step (e.g., hundreds of time steps) minimizes computing power and time.

The model optimization module 308 is configured to implement global optimization and/or local optimization steps to optimize the connectivity model. The model optimization module 308 may use global optimization and/or local optimization to evaluate generated the hydrocarbon field development plans and associated production predictions. Global optimization and/or local optimization may produce a plurality of prediction models using the model prediction module 306. The model optimization module 308 may reduce computational resources and/or time when performing the optimization process because of generating the prediction model in a single or relatively few time steps.

The model optimization module 308 may implement global optimization and/or local optimization using a variety of optimization algorithms well-known in the art. For example, global optimization algorithms may include, but are not limited to a generic algorithm (GA), particle swarm optimization algorithm (PSO), simulated annealing algorithm (SA), or pattern search algorithm. Local optimization algorithms that further refine model optimization may include, but are not limited to a random walk algorithm or a polytope optimization algorithm. For example, in one embodiment, the model optimization module 308 may use the GA and random walk algorithm to provide global and local optimization. The GA improves global optimization results by producing a plurality of generations, where each generation generates a plurality of genomes. Each genome represents a possible hydrocarbon field development plan that includes the number of wells and well locations. The model optimization module 308 may determine the fitness of each genome by determining the economic value of the field optimization plan. For example, economic value for a hydrocarbon well may be determined by equation 8 as shown below:

$$\text{Economic value} = Q_o \times \text{hydrocarbon price} - \text{Well count} \times \text{Well cost} \quad (8)$$

In equation 8, the variable Qo represents the quantity of hydrocarbon produced by the well (e.g., oil production). The GA produces an optimized genome after one or more generations. The random walk algorithm optimizes or further improves the results by randomly selecting wells and moving them locally for improved economic values.

The model optimization module 310 is configured to write the optimized connectivity model received from the model optimization module 308 into well files compatible with the reservoir simulators, such as Eclipse or PSim. The model optimization module 310 may subsequently automatically run a verification case with the optimized hydrocarbon field development plan to verify the overall computation of the connectivity model.

FIG. 4 is flow chart of an embodiment of method 400 for creating a hydrocarbon field development plan. Method 400 may perform steps substantially similar to the operation of the field development optimization architecture 300. Specifically, method 400 may determine optimal well counts, well locations, and/or well types to build an optimal connectivity model used for a hydrocarbon field development plan. Method 400 may determine a travel time using a fast marching method and uses an analytical saturation solver, such as the Buckley-Leverett equation to build model predictions. Method 400 may optimize the connectivity model by performing local and global optimization algorithms.

Method 400 may start at step 402 and initializes a connectivity model using a plurality of field development data. Recall that the field development data include, but is not limited to reservoir descriptions, economic factors, well development type, and/or reservoir simulation results. The reservoir simulation results may be obtained using a reservoir simulator known by persons of ordinary skill in the art, such as Eclipse or PSim. After method 400 completes step 402, method 400 moves to step 404 and calibrates the connectivity model based on the reservoir simulation results. Calibrating the connectivity model involves simulating one or more reservoir simulation cases where wells are randomly placed in the reservoir and subsequently tuning using an internal optimization algorithm one or more parameters, for example, multipliers of velocity and maximum saturation changes, associated with the connectivity models.

At step 406, method 400 may determine a travel time between one or more wells and/or one or more reservoir cells using a fast marching method. The travel time may depend on velocity of the oil and/or gas. Method 400 may improve the approximation of the velocity by calibrating multiples of velocity in step 404. Other embodiments of method 400 at step 406 may compute the velocity using linear pressure or the approximating 2D pressure solver. Method 400 may subsequently move to step 408 to determine the hydrocarbon saturation based on the travel time. The hydrocarbon saturation may be derived from the Buckley-Leverett equation and expressed in terms of the travel time. In one embodiment, at step 408, method 400 may generate a model prediction in a single step rather than implementing a plurality of time steps to create the final model prediction.

Method 400 may then move to step 410 and optimize the connectivity model. In one embodiment, method 400 may optimize the connectivity model using global optimization and local optimization algorithms. When performing global optimization, method 400 build model predictions using the hydrocarbon saturation define in terms of the travel time. Method 400 may generate a plurality of possible development plans with varying number of wells and well locations. Method 400 may create a model prediction and evaluates the model prediction based on the economic value. To perform global optimization, method 400 may use one of the following algorithms: GA, PSO, SA, and/or pattern search. To perform local optimization, method 400 may use one of the following algorithms: random walk or polytope optimization algorithm. After completing step 410, method 400 may then proceed to move step 412 to verify the connectivity model.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means±10% of the subsequent number, unless otherwise stated.

Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure.

While several embodiments have been provided in the present disclosure, it may be understood that the disclosed embodiments might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, the various embodiments described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

In closing, it should be noted that the discussion of any reference is not an admission that it is prior art to the present embodiments, especially any reference that may have a publication date after the priority date of this application. At the same time, each and every claim below is hereby incorporated into this detailed description or specification as additional embodiments.

Although the systems and processes described herein have been described in detail, it should be understood that various changes, substitutions, and alterations can be made without departing from the spirit and scope of the disclosed embodiments as defined by the following claims. Those skilled in the art may be able to study the preferred embodiments and identify other ways to practice the disclosed embodiments that are not exactly as described herein. It is the intent of the inventors that variations and equivalents of the disclosed embodiments are within the scope of the claims while the description, abstract, and drawings are not to be used to limit the scope of the disclosed embodiments. The disclosed embodiments are specifically intended to be as broad as the claims below and their equivalents.

All of the references cited herein are expressly incorporated by reference. The discussion of any reference is not an admission that it is prior art to the disclosed embodiments, especially any reference that may have a publication data after the priority date of this application.

What is claimed is:

1. A method for improving hydrocarbon recovery from an oil and gas field, comprising:

initializing a connectivity model;
   calibrating the connectivity model based on a plurality of reservoir simulation results;
   determining a travel time between wells and reservoir cells using a fast marching method;
   determining a hydrocarbon saturation based on the travel time to construct a model prediction;
   wherein the connectivity model uses a global optimization and a local optimization;
   determining the location of wells in order to optimize efficiency and maintain well safety;
   drilling one or more hydrocarbon wells at said locations in order to optimize efficiency and maintain well safety; and
   improving the efficiency of hydrocarbon recovery for said one or more hydrocarbon wells,
   wherein said connectivity model reduces the computational expense and improves modeling accuracy.

2. The method of claim 1, further comprising: verifying, by the specially programmed computing system, the optimized connectivity model.

3. The method of claim 1, wherein the global optimization is obtained using a genetic algorithm.

4. The method of claim 1, wherein the local optimization is obtained using a random walk optimization algorithm.

5. The method of claim 1, wherein the hydrocarbon saturation based on the travel time is determined from a Buckley-Leverett equation.

6. The method of claim 1, wherein the travel time is based on a velocity between a first cell and a second cell.

7. The method of claim 6, wherein the velocity is based on Darcy's law.

8. The method of claim 6, wherein the velocity is determined using a linear pressure computation.

9. The method of claim 6, wherein the velocity is determined using an approximate two dimensional pressure solver.

10. An apparatus comprising:
    a processor, wherein the processor obtains computer executable instructions stored on a non-transitory medium that when executed by the processor causes the apparatus to:
    initialize a connectivity model based on reservoir descriptions, economic factors, and development type;
    calibrate the connectivity model by automatically tuning one or more parameters in the connectivity model to a plurality of reservoir simulation results;
    construct a model prediction based on the connectivity model, wherein the connectivity model determines a hydrocarbon saturation from a travel time based on reservoir connectivity;
    optimize the connectivity model using a global optimization and a local optimization;
    determine the location of wells in order to optimize efficiency and maintain well safety wherein one or more hydrocarbon wells are drilled at said location to optimize efficiency and maintain well safety; and
    improving the efficiency of hydrocarbon recovery for drilled wells, wherein said connectivity model reduces the computational expense and improves modeling accuracy.

11. The apparatus of claim 10, wherein the travel time is computed using a fast marching method.

12. The apparatus of claim 10, wherein the computer executable instructions, when executed by the processor, further cause the apparatus to verify the optimized connectivity model.

13. The apparatus of claim 10, wherein the global optimization is obtained using a genetic algorithm.

14. The apparatus of claim 10, wherein the local optimization is obtained using a random walk optimization.

15. The apparatus of claim 10, wherein a Buckley-Leverett equation is used to determine the hydrocarbon saturation from the travel time.

16. A system comprising:
a model initialization module adapted to initialize a connectivity model;
a model calibration module adapted to calibrate the connectivity model based on a plurality of reservoir simulation results;
a model prediction module adapted to:
determine a travel time between wells and reservoir cells using a fast marching method; and
determine a hydrocarbon saturation based on the travel time to construct a model prediction;
a model optimization module adapted to optimize the connectivity model using a global optimization and a local optimization;
a model verification module adapted using the optimized connectivity model to determine the location of wells in order to optimize efficiency and maintain well safety wherein one or more hydrocarbon wells are drilled at said location to optimize efficiency and maintain well safety; and
improving the efficiency of hydrocarbon recovery for drilled wells,
wherein said connectivity model reduces the computational expense and improves modeling accuracy.

17. The system of claim 16, wherein the global optimization is obtained using a genetic algorithm.

18. The system of claim 16, wherein the local optimization is obtained using a random walk optimization algorithm.

19. The system of claim 18, wherein the hydrocarbon saturation based on the travel time is determined from a Buckley-Leverett equation.

* * * * *